United States Patent

Okui et al.

[11] Patent Number: 5,908,734
[45] Date of Patent: Jun. 1, 1999

[54] IMAGE FORMATION METHOD WITH A POST EXPOSURE HEATING STEP

[75] Inventors: Toshiki Okui; Takeshi Iwai; Hiroshi Komano, all of Kanagawa, Japan

[73] Assignee: Tokyo Ohka Kogyo Co., Ltd., Kanagawa, Japan

[21] Appl. No.: 08/890,309

[22] Filed: Jul. 9, 1997

[30] Foreign Application Priority Data

Jul. 9, 1996 [JP] Japan ................................. 8-198304

[51] Int. Cl.⁶ ..................................................... G03C 5/56
[52] U.S. Cl. .......................... 430/325; 430/302; 430/330; 430/945
[58] Field of Search ..................... 430/302, 325, 430/330

[56] References Cited

U.S. PATENT DOCUMENTS

| | | | |
|---|---|---|---|
| 4,877,719 | 10/1989 | Higashi et al. | 430/326 |
| 5,227,281 | 7/1993 | Gaschler et al. | 430/325 |

FOREIGN PATENT DOCUMENTS

| | | |
|---|---|---|
| 0049840 | 4/1982 | European Pat. Off. . |
| 0053708 | 6/1982 | European Pat. Off. . |
| 57-119343 | 7/1982 | Japan . |
| 60-239736 | 11/1985 | Japan . |
| 5-78410 | 3/1993 | Japan . |
| 5-107758 | 4/1993 | Japan . |
| 6-34198 | 2/1994 | Japan . |
| 6-148885 | 5/1994 | Japan . |
| 07261407 | 10/1995 | Japan . |
| 1387350 | 3/1975 | United Kingdom . |
| 2112952 | 7/1983 | United Kingdom . |
| 2273101 | 8/1994 | United Kingdom . |

*Primary Examiner*—Kathleen Duda
*Assistant Examiner*—Jill N. Holloman
*Attorney, Agent, or Firm*—Sughrue, Mion, Zinn, Macpeak & Seas, PLLC

[57] ABSTRACT

An image formation method which comprises: (a) selectively exposing a photosensitive layer with a visible laser beam, (b) heating the exposed photosensitive layer at a temperature of from 36 to 48° C. for 10 seconds to 3 minutes, and (c) developing the photosensitive layer.

7 Claims, No Drawings

IMAGE FORMATION METHOD WITH A POST EXPOSURE HEATING STEP

FIELD OF THE INVENTION

The present invention relates to an image formation method. Particularly, the present invention relates to a method which forms an image having high reproducibility with its relief pattern undergoing little variation in thickness with exposure energy and exhibits wide margins for exposure temperature.

BACKGROUND OF THE INVENTION

A photosensitive lithographic printing plate, which has been widely used in the field of offset printing, generally comprises an anodized aluminum substrate having provided thereon a photopolymerizable photosensitive layer and an oxygen barrier film in this order. The recent development of electronic devices has put so-called desktop publishing to practical use, in which input of data, such as manuscripts and images, editing, and proofreading, are carried out on a computer, and which has made it feasible to edit images at a high speed. As a result, it has been demanded to manage plate making on a computer, and attention has been paid to a laser direct printing plate which can be prepared by directly exposing a photosensitive printing plate by scanning with a visible laser beam without using a negative mask. In particular, it has been keenly demanded to develop a printing plate for exposure to a beam of an argon laser having a wavelength of 488 nm and a YAG laser having a wavelength of 532 nm from the standpoint of a broad exposure range. Photosensitive printing plates suitable for exposure to such a laser beam include lithographic printing plates disclosed in JP-A-60-239736, JP-A-5-78410, JP-A-5-107758, JP-A-6-148885, and JP-A-6-34198 (the term "JP-A" as used herein means an "unexamined published Japanese patent application").

These conventional photosensitive lithographic printing plates have high sensitivity but tend to show great variation in thickness of a pattern with a slight change in exposure energy of the visible laser and have narrow margins for exposure temperature. They hardly provide a relief pattern with high reproducibility and are very difficult to handle.

To solve these problems, it has been proposed to hold an exposed printing plate at room temperature for 10 to 30 minutes before development or to heat the photosensitive layer at 50 to 180° C. for 5 seconds to 10 minutes either during or after exposure as disclosed in JP-A-57-119343. However, these methods have difficulty in forming a relief pattern with high precision because of involvement of partial collapse of the pattern.

SUMMARY OF THE INVENTION

An object of the present invention is to provide an image formation method which achieves excellent reproducibility, causing little variation in the thickness of a relief pattern with a change in exposing energy, and has wide margins for exposure temperature.

Another object of the present invention is to provide a method for producing a lithographic printing plate using the above image formation method.

These and other objects of the present invention have been accomplished by an image formation method which comprises:

(a) selectively exposing a photosensitive layer with a visible laser beam;

(b) heating the exposed photosensitive layer at a temperature of from 36 to 48° C. for 10 seconds to 3 minutes; and (c) developing the photosensitive layer.

Furthermore, these and other objects of the present invention have been accomplished by a method for producing a lithographic printing plate according to the above image formation method.

DETAILED DESCRIPTION OF THE INVENTION

In the light of the above-mentioned circumstances, the inventors of the present invention have conducted extensive investigation. As a result, they have found that an image formation method comprising heating a selectively exposed printing plate at a specific temperature for a specific time provides a relief pattern of high reproducibility showing reduced variation in relief pattern thickness with variation of exposure energy and also exhibits wide margins for exposure temperature. The present invention has been completed based on this finding.

The method according to the present invention is effectively applicable to image formation using a photoresist in the production of various printing plates, such as a lithograph, an intaglio and a letterpress, a printed wiring board, IC, and LSI, and is especially effective for preparing a lithographic printing plate. Lithographic printing plates include those comprising a substrate having thereon a photosensitive layer curable by a visible laser beam as described in the preceding publications.

Examples of the substrate include plates of metal (e.g., aluminum, zinc, copper, chromium); plates plated with these metals; and sheets of plastics (e.g., polyethylene terephthalate, polyvinyl chloride, cellulose acetate). An aluminum substrate prepared by mechanical surface graining, chemical etching or electropolishing followed by anodizing in an electrolytic solution containing sulfuric acid, phosphoric acid, oxalic acid, chromic acid, amidosulfonic acid or the like and an aluminum substrate prepared by making the surface of the anodized aluminum substrate hydrophilic are particularly preferred. In the treatment for making the anodized aluminum surface hydrophilic, an aqueous solution of sodium silicate or the like is preferably used.

The photosensitive layer provided on the substrate comprises a photosensitive composition comprising a polymeric binder, a photopolymerizable monomer and a photopolymerization initiator. If desired, the photosensitive composition can further contain additives, such as a plasticizer, a thermal polymerization inhibitor, a defoaming agent, and a dye.

Examples of the polymeric binder include copolymers comprising a monomer having a carboxyl group (e.g., acrylic acid, methacrylic acid), and methyl acrylate, methyl methacrylate, ethyl acrylate, ethyl methacrylate, 2-hydroxyethyl acrylate, 2-hydroxyethyl methacrylate, 2-hydroxypropyl methacrylate, N-butyl acrylate, N-butyl methacrylate, isobutyl acrylate, isobutyl methacrylate, benzyl acrylate, benzyl methacrylate, phenoxy acrylate, phenoxy methacrylate, isobornyl acrylate, isobornyl methacrylate, glycidyl methacrylate, styrene, acrylic amide or acrylonitrile; phenol novolak type epoxy acrylate resins; phenol novolak type epoxy methacrylate resins; cresol novolak type epoxy acrylate resins; cresol novolak type epoxy methacrylate resins; bisphenol A type epoxy acrylate resins; and bisphenol S type epoxy acrylate resins. Among these, preferred are those having an acryloyl or methacryloyl group, such as phenol novolak type epoxy acrylate resins, because improved exposure sensitivity can be obtained. These polymeric binders may be used alone or as a combination of two or more thereof.

Examples of the photopolymerizable monomer include monofunctional monomers (monomers having one functional group, e.g., acrylic acid, methacrylic acid, fumaric acid, maleic acid, monomethyl fumarate, monoethyl fumarate, 2-hydroxyethyl acrylate, 2-hydroxyethyl methacrylate, ethylene glycol monomethyl ether acrylate, ethylene glycol monomethyl ether methacrylate, ethylene glycol monoethyl ether acrylate, ethylene glycol monoethyl ether methacrylate, glycerol acrylate, glycerol methacrylate, acrylic amide, methacrylic amide, acrylonitrile, methacrylonitrile, methyl acrylate, methyl methacrylate, ethyl acrylate, ethyl methacrylate, isobutyl acrylate, isobutyl methacrylate, 2-ethylhexyl acrylate, 2-ethylhexyl methacrylate, benzyl acrylate, benzyl methacrylate); and polyfunctional monomers (monomers having at least two functional groups, e.g., ethylene glycol diacrylate, ethylene glycol dimethacrylate, triethylene glycol diacrylate, triethylene glycol dimethacrylate, tetraethylene glycol diacrylate, tetraethylene glycol dimethacrylate, butylene glycol dimethacrylate, propylene glycol diacrylate, propylene glycol dimethacrylate, trimethylolpropane triacrylate, trimethylolpropane trimethacrylate, tetramethylolpropane tetraacrylate, tetramethylolpropane tetramethacrylate, pentaerythritol triacrylate, pentaerythritol trimethacrylate, pentaerythritol tetraacrylate, pentaerythritol tetramethacrylate, dipentaerythritol pentaacrylate, dipentaerythritol pentamethacrylate, dipentaerythritol hexaacrylate, dipentaerythritol hexamethacrylate, 1,6-hexanediol diacrylate, 1,6-hexanediol dimethacrylate, cardoepoxy diacrylate). These monomers may be used alone or as a combination of two or more thereof.

Examples of the photopolymerization initiator include photopolymerization initiators which are polymerizable on application of a visible laser beam of low energy (e.g., titanocene compounds, triazine compounds, acridine compounds, imidazole compounds); combinations of these initiators; and combinations of these initiators with other initiators and/or sensitizers. Preferred combinations of the photopolymerization initiator include a combination of a titanocene compound and a triazine compound; a combination of a titanocene compound, a triazine compound and an acridine compound; a combination of a triazine compound and a hexaaryl biimidazole compound; a combination of a hexaaryl biimidazole compound and a (p-dialkylaminobenzylidene) ketone; a combination of a triazine compound and a merocyanine dye; and a combination of a triazine compound and a coumarin dye. A combination of at least two of a titanocene compound, a triazine compound and an acridine compound is particularly preferred. Preferably, the titanocene compound is added in an amount of 3 to 20 parts by weight based on 100 parts by weight of the total weight of the polymeric binder, the photopolymerizable monomer and the photopolymerization initiator; the triazine compound is added in an amount of 1 to 5 parts by weight based on 10 parts by weight of the titanocene compound; and the acridine compound is added in an amount of 0 to 3 parts by weight based on 10 parts by weight of the titanocene compound.

Examples of the titanocene compound include bis (cyclopentadienyl)-bis[2,6-difluoro-3-(pyr-1-yl)phenyl]-titanium, bis(cyclopentadienyl)-bis[2,6-difluoro-2-(pyr-1-yl)phenyl]titanium, bis(cyclopentadienyl)-bis(2,3,4,5,6-pentafluorophenyl)titanium, and bis(cyclopentadienyl)-bis[2,5-difluoro-3-(pyr-1-yl)phenyl]titanium.

Examples of the triazine compound include 2,4-bistrichloromethyl-6-(3-bromo-4-methoxy)phenyl-s-triazine, 2,4-bistrichloromethyl-6-(2-bromo-4-methoxy)phenyl-s-triazine, 2,4-bistrichloromethyl-6-(3-bromo-4-methoxy)styrylphenyl-s-triazine, and 2,4-bistrichloromethyl-6-(2-bromo-4-methoxy)styrylphenyl-s-triazine.

Examples of the acridine compound include 9-phenylacridine, 1,7-bis(9-acridinyl)heptane, 1,5-bis(9-acridinyl)pentane, and 1,3-bis(9-acridinyl)propane.

Examples of the sensitizer include xanthene dyes, (e.g., Eosine B (C.I. No. 45400), Eosine J (C.I. No. 45380), alcohol-soluble Eosine (C.I. No. 45386), Cyanosine (C.I. No. 45410), Rose Bengal, Erythrosine (C.I. No. 45430), 2,3,7-trihydroxy-9-phenylxanthen-6-one, Rhodamine 6G); thiazine dyes (e.g., Thionine (C.I. No. 52000), Azule A (C.I. No. 52005), Azule C (C.I. No. 52002)); pyronine dyes (e.g., Pyronine B (C.I. No. 45005), Pyronine GY (C.I. No. 45005)); and coumarin dyes (e.g., 7-diethylamino-3-(2-benzimidazolyl)coumarin). The sensitizer is preferably added in an amount of 1 to 3 parts by weight based on 100 parts by weight of the total weight of the polymeric binder, the photopolymerizable monomer and the photopolymerization initiator.

To further improve sensitivity, the photopolymerizable composition may contain 1-hydroxycyclohexyl phenyl ketone, 2,2-dimethoxy-1,2-diphenylethan-1-one, 2-methyl-1-[4-(methylthio)phenyl]-2-morpholinopropan-1-one, 2-benzyl-2-dimethylamino-1-(4-morpholinophenyl)-butan-1-one, 2-hydroxy-2-methyl-1-phenylpropan-1-one, 2,4,6-trimethylbenzoyldiphenyl-phosphine oxide, 1-[4-(2-hydroxyethoxy)phenyl]-2-hydroxy-2-methyl-1-propan-1-one, 2,4-diethylthioxanthone, 2-chlorothioxanthone, 2,4-dimethylthioxanthone, 3,3-dimethyl-4-methoxybenzophenone, benzophenone, 1-chloro-4-propoxythioxanthone, 1-(4-isopropylphenyl)-2-hydroxy-2-methylpropan-1-one, 1-(4-dodecylphenyl)-2-hydroxy-2-methylpropan-1-one, 4-benzoyl-4'-methyldimethyl sulfide, 4-dimethylaminobenzoic acid, methyl 4-dimethylaminobenzoate, ethyl 4-dimethylaminobenzoate, butyl 4-dimethylaminobenzoate, 2-ethylhexyl 4-dimethylaminobenzoate, 2-isoamyl-4-dimethylaminobenzoate, 2,2-diethoxyacetophenone, benzyldimethyl ketal, benzyl-β-methoxyethyl acetal, 1-phenyl-1,2-propanedione-2-(o-ethoxycarbonyl) oxime, methyl o-benzoylbenzoate, bis(4-dimethylaminophenyl) ketone, 4,4'-bisdiethylaminobenzophenone, 4,4'-dichlorobenzophenone, benzil, benzoin, benzoin methyl ether, benzoin ethyl ether, benzoin isopropyl ether, benzoin n-butyl ether, benzoin isobutyl ether, benzoin butyl ether, p-dimethylamino-acetophenone, p-tert-butyltrichloroacetophenone, p-tert-butyldichloroacetophenone, thioxanthone, 2-methylthioxanthone, 2-isopropylthioxanthone, dibenzosuberone, α,α-dichloro-4-phenoxyacetophenone, and pentyl 4-dimethylaminobenzoate.

Preferably, the photosensitive composition comprises:
(a) 10 to 75 parts by weight of a polymeric binder,
(b) 5 to 60 parts by weight of a photopolymerizable monomer, and
(c) 1 to 35 parts by weight of a photopolymerization initiator,
each based on 100 parts by weight of the total weight of the composition.

In order to form a uniform photosensitive layer, the photosensitive composition can be dissolved in a solvent.

Examples of the solvent include acetone, methyl ethyl ketone, methyl isobutyl ketone, diethyl ketone, methyl amyl ketone, ethylene glycol monomethyl ether, ethylene glycol monoethyl ether, propylene glycol monomethyl ether, propylene glycol monoethyl ether, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 2-methoxybutyl acetate, 3-methoxybutyl acetate, 4-methoxybutyl acetate, 2-methyl-3-methoxybutyl acetate, 3-methyl-3-methoxybutyl acetate, 3-ethyl-3-methoxybutyl acetate, 2-ethoxybutyl acetate, 4-ethoxybutyl acetate, 4-propoxybutyl acetate, and 2-methoxypentyl acetate. These solvents may be used alone or as a combination of two or more thereof. The solvent is preferably added in an amount of 200 to 1500 parts by weight based on 100 parts by weight of the total weight of the polymeric binder, the photopolymerizable monomer and the photopolymerization initiator.

A lithographic printing plate can be produced by applying the photosensitive composition, preferably as dissolved in the aforesaid solvent, to a substrate by means of an applicator, such as a whirler, a bar coater or a spin coater, to a dry coating weight of 0.5 to 10 g/m$^2$, followed by drying by allowing to stand at room temperature for several hours to several days or by placing in a warm air heater or an infrared heater for several ten minutes to several hours. If necessary, an oxygen barrier film can be provided on the photosensitive layer to prevent oxygen desensitization. An oxygen barrier film can be formed by coating the photosensitive layer with a composition comprising a polyvinyl acetate resin having an average saponification value of 70 or higher or a water-soluble polyamide resin and a solvent, such as water or an alcohol (e.g., ethanol, methanol) by means of a whirler, a bar coater, a spin coater or the like to a dry coating thickness of 0.1 to 5 g/m$^2$, followed by drying.

According to the image formation method of the present invention, a photosensitive layer is selectively exposed to light having an energy quantity of 0.1 to 10 mJ/cm$^2$ with an argon laser having a wavelength of 488 nm, a YAG laser having a wavelength of 532 nm, etc. After the exposure and prior to development, the exposed photosensitive layer is subjected to a heat treatment at a temperature of 36 to 48° C., preferably 38 to 43° C., for 10 seconds to 3 minutes, preferably 15 to 90 seconds. This heat treatment makes it possible to cure the photosensitive layer with relatively low exposure energy to form a relief image having high reproducibility with reduced thickness dependence on the exposure energy and with wide margins for exposure temperature. If the heating time is shorter than 10 seconds or if the heating temperature is lower than 36° C., the relief pattern layer tends to suffer from great reduction in thickness in parts, sometimes resulting in pattern missing. If the heating time exceeds 3 minutes or if the heating temperature exceeds 48° C., the relief pattern tends to suffer from collapse in parts.

The development of the exposed photosensitive layer may carried out by spraying with or dipping in a developer for about 30 to 300 seconds. From the consideration for the environment or the human body, an alkaline developer is preferably used. Examples of the alkaline developer include aqueous solutions of a hydroxide, carbonate, hydrogencarbonate, phosphate or pyrophosphate of an alkali metal (e.g., lithium, sodium, potassium); aqueous solutions of a primary amine (e.g., benzylamine, butylamine), a secondary amine (e.g., dimethylamine, dibenzylamine, diethanolamine), a tertiary amine (e.g., trimethylamine, triethylamine, triethanolamine), a cyclic amine (e.g., morpholine, piperazine, pyridine), or a polyamine (e.g., ethylenediamine, hexamethylenediamine); aqueous solutions of an ammonium hydroxide compound (e.g., tetraethylammonium hydroxide, trimethylbenzylammonium hydroxide, trimethylphenylbenzylammonium hydroxide); aqueous solutions of a sulfonium hydroxide compound (e.g., trimethylsulfonium hydroxide, diethylmethylsulfonium hydroxide, dimethylbenzylsulfonium hydroxide); and buffer solutions containing choline or a silicate.

According to the method of the present invention, high image reproducibility can be reached with reduced dependence of pattern thickness upon variations in exposure energy and with wide margins for exposure temperature. The image formation method of the invention is particularly practical for producing a lithographic printing plate.

The present invention will now be illustrated in greater detail with reference to Examples, but it should be understood that the invention is not construed as being limited thereto. Unless otherwise noted, all the parts, percents, and ratios are by weight.

EXAMPLE

A photosensitive composition was prepared by mixing the following components.

| (1) | Methacrylic acid/methyl methacrylate/2-hydroxyethyl methacrylate/benzyl methacrylate copolymer (50/20/20/10; weight average molecular weight: about 20000) | 60 | parts |
|---|---|---|---|
| (2) | Trimethylolpropane triacrylate | 10 | parts |
| (3) | 2,4-Bis(trichloromethyl)-6-(3-chloro-4-methoxy)styryl-1,3,5-s-triazine | 3 | parts |
| (4) | Bis(cyclopentadienyl)-bis[2,6-difluoro-3-(pyr-1-yl)phenyl]titanium | 10 | parts |
| (5) | 9-Phenylacridine | 3 | parts |
| (6) | 7-Diethylamino-3-(2-benzimidazolyl)-coumarin | 1 | part |
| (7) | Trichloroacetamide | 0.1 | parts |
| (8) | Propylene glycol monoethyl ether acetate | 50 | parts |
| (9) | Methyl isobutyl ketone | 100 | parts |

The photosensitive composition was applied to an anodized aluminum plate having a thickness of 0.3 mm by means of a whirler to a dry coating weight of 3 g/m$^2$ and dried at 60° C. for 5 minutes to form a photosensitive layer.

Eighty parts of a 1:1 mixture of partially saponified (saponification value: 90) polyvinyl acetate and partially saponified (saponification value: 80) polyvinyl acetate were dissolved in a water/methanol (70/30) mixed solvent, and the solution was applied to the photosensitive layer by means of a whirler to a dry coating thickness of 0.5 g/m$^2$ and dried at 60° C. for 5 minutes to provide a photosensitive lithographic printing plate.

Each plate was set on an argon laser exposer (LPS Plotter, manufactured by Think Laboratory Co., Ltd.; wavelength: 488 nm) and was imagewise exposed to light with an argon laser at an energy quantity of 0.5 mJ/cm$^2$ in an atmosphere of 25° C. in a manner as to form a dot relief image having an area ratio varying from 1 to 99%. After light exposure, the plate was heated at 40° C. for 30 seconds and then developed by spraying with a 0.5% aqueous solution of sodium carbonate at 25° C. for 60 seconds, followed by drying at 100° C. for 2 minutes. Finally, the entire surface of the developed photosensitive layer was exposed to ultraviolet light of an ultrahigh pressure mercury lamp for 1 minute.

Lithographic printing plates were produced in the same manner as described above, except for varying the heating conditions, to compare the reproducibility of the dot relief image. The results obtained are shown in Table 1 below.

Furthermore, lithographic printing plates were produced in the same manner as described above, except for changing the exposure energy to 0.75 mJ/cm² or 1 mJ/cm², and also changing the heating conditions as shown in Tables 2 and 3 below, to compare thr reducibility of the dot relief image. The results are shown in Tables 2 and 3.

The image reproducibility was evaluated according to the following rating system.

A . . . Dots having an area ratio of 1 to 99% were reproduced.
B . . . Dots having an area ratio of 2 to 98% were reproduced.
C . . . Dots having an area ratio exceeding 3% and less than 97% were reproduced.
D . . . Dots having an area ratio exceeding 4% and less than 96% were reproduced.
E . . . Dots having an area ratio exceeding 5% and less than 95% were reproduced.

TABLE 1

Exposure Energy: 0.5 mJ/cm²

| Heating Time | Heating Temperature (° C.) | | | | |
|---|---|---|---|---|---|
| (sec) | 32 | 37 | 42 | 47 | 52 |
| 8 | E | E | E | D | D |
| 12 | E | B | B | B | C |
| 30 | E | B | A | B | C |
| 120 | E | B | B | B | D |
| 240 | E | C | C | C | D |
| 720 | D | D | D | D | D |

TABLE 2

Exposure Energy: 0.75 mJ/cm²

| Heating Time | Heating Temperature (° C.) | | | | |
|---|---|---|---|---|---|
| (sec) | 32 | 37 | 42 | 47 | 52 |
| 8 | E | E | C | D | D |
| 12 | E | B | B | B | C |
| 30 | E | B | A | B | C |
| 120 | E | B | B | B | D |
| 240 | D | C | C | D | D |
| 720 | C | D | D | D | D |

TABLE 3

Exposure Energy: 1 mJ/cm²

| Heating Time | Heating Temperature (° C.) | | | | |
|---|---|---|---|---|---|
| (sec) | 32 | 37 | 42 | 47 | 52 |
| 8 | E | C | D | D | D |
| 12 | E | B | B | B | D |
| 30 | E | B | A | B | D |
| 120 | D | B | B | B | D |
| 240 | C | C | D | D | D |
| 720 | C | C | D | D | D |

Furthermore, lithographic printing plates were produced in the same manner as described above, except for changing the exposure energy to 0.75 mJ/cm² and changing the temperature to 20° C. or 30° C. The dot relief reproducibility was evaluated in the same manner as described above. The results obtained are shown in Tables 4 and 5 below.

TABLE 4

Exposure Temperature: 20° C.

| Heating Time | Heating Temperature (° C.) | | | | |
|---|---|---|---|---|---|
| (sec) | 32 | 37 | 42 | 47 | 52 |
| 8 | E | E | D | C | C |
| 12 | E | B | B | B | C |
| 30 | E | B | A | B | C |
| 120 | E | B | B | B | D |
| 240 | D | C | C | D | D |
| 720 | C | D | D | D | D |

TABLE 5

Exposing Temperature: 30° C.

| Heating Time | Heating Temperature (° C.) | | | | |
|---|---|---|---|---|---|
| (sec) | 32 | 37 | 42 | 47 | 52 |
| 8 | E | C | D | D | D |
| 12 | E | B | B | B | D |
| 30 | E | B | A | B | D |
| 120 | C | B | B | B | D |
| 240 | C | D | D | D | D |
| 720 | D | D | D | D | D |

As is apparent from the results in Tables 1 through 5, a heat treatment at 36 to 48° C. for 10 seconds to 3 minutes following exposure to visible laser beam and preceding development processing is effective to improve reproducibility of a dot relief image.

While the invention has been described in detail and with reference to specific examples thereof, it will be apparent to one skilled in the art that various changes and modifications can be made therein without departing from the spirit and scope thereof.

This application is based on application No. Hei 8-198304 filed in Japan, the entire content of which is incorporated hereinto by reference.

What is claimed is:

1. An image formation method which comprises:

(a) selectively exposing a photosensitive layer with a visible laser beam, (b) heating the exposed photosensitive layer at a temperature of from 36 to 48° C. for 10 seconds to 3 minutes, and (c) developing the photosensitive layer, wherein the photosensitive layer comprises a photosensitive composition comprising a polymeric binder, a photopolymerizable monomer, and a photopolymerization initiator.

2. The method as claimed in claim 1, wherein the heating is carried out at a temperature of from 38 to 43° C.

3. The method as claimed in claim 1, wherein the photopolymerization initiator is a combination of at least two of a titanocene compound, a triazine compound and an acridine compound.

4. The method as claimed in claim 1, wherein the method is a method for producing a lithographic printing plate.

5. The method as claimed in claim 4, wherein the lithographic printing plate comprises the photosensitive layer provided on a substrate, and an oxygen barrier film provided on the photosensitive layer.

6. The method as claimed in claim 1, wherein the polymeric binder, the photopolymerizable monomer, and the photopolymerization initiator are contained in the photosensitive composition in an amount of 10 to 75 parts by weight, 5 to 60 parts by weight, and 1 to 35 parts by weight, respectively, each based on 100 parts by weight of the total weight of the composition.

7. The method as claimed in claim 1, wherein the photosensitive layer is selectively exposed to light having an energy quantity of 0.1 to 10 mJ/cm$^2$ with an argon laser having a wavelength of 488 nm or a YAG laser having a wavelength of 532 nm.

* * * * *